United States Patent [19]
Sugiyama et al.

[11] Patent Number: 5,747,860
[45] Date of Patent: May 5, 1998

[54] METHOD AND APPARATUS FOR FABRICATING SEMICONDUCTOR DEVICE WITH PHOTODIODE

[75] Inventors: Mitsuhiro Sugiyama; Tsutomu Tashiro, both of Tokyo, Japan

[73] Assignee: Nec Corporation, Tokyo, Japan

[21] Appl. No.: 613,077

[22] Filed: Mar. 8, 1996

[30] Foreign Application Priority Data

Mar. 13, 1995 [JP] Japan .................................. 7-052700

[51] Int. Cl.$^6$ .......................................... H01L 31/0232
[52] U.S. Cl. ............................ 257/432; 257/19; 257/21; 257/201; 257/466; 385/49; 385/130
[58] Field of Search .............................. 257/19, 21, 201, 257/432, 466; 385/49, 130

[56] References Cited

U.S. PATENT DOCUMENTS

| | | | |
|---|---|---|---|
| 4,210,923 | 7/1980 | North | 257/432 |
| 4,847,665 | 7/1989 | Mand | 257/432 |
| 5,357,122 | 10/1994 | Okubura et al. | 257/432 |
| 5,444,805 | 8/1995 | Mayer | 385/49 |

FOREIGN PATENT DOCUMENTS

| | | | |
|---|---|---|---|
| 3161980 | 7/1991 | Japan | 257/432 |

OTHER PUBLICATIONS

"Integrated Waveguide–Photodetector Using Si/SiGe Multiple . . .", V.P. Kesan, P.G. May, E. Bassous, and S.S. Iyer, IEDM 90–637, pp. 26.7.1–4.

Integrated Waveguides and Photodetectors in SiGe for 1.3 μm Operation.

*IEEE Photonics Tech. Lett.* Splett et al vol. 6 No. 1 Jan. 1994 pp. 59–61.

*Primary Examiner*—Jerome Jackson
*Attorney, Agent, or Firm*—Laff, Whitesel, Conte & Saret Ltd.

[57] ABSTRACT

On a surface of a silicon substrate, $N^+$ type buried layer and N-type epitaxial layer are formed in order, and an isolation layer reaching the silicon substrate from the surface of the N-type epitaxial layer is formed to define a photodiode. In the surface of the photodiode, a rectangular recess is selectively formed toward inside of the N-type epitaxial layer. On the side face of the recess, a silicon oxide layer is formed. In the region surrounded by the silicon oxide layer, a photo absorbing layer and so forth is formed. On the other hand, in an optical waveguide, a LOCOS oxide layer is formed toward inside from the surface of the N-type epitaxial layer. The N-type epitaxial layer is sandwiched between the LOCOS oxide layer and the $N^+$ type buried layer. The refraction indexes of the LOCOS oxide layer and the $N^+$ type buried layer are smaller than that of the N-type epitaxial layer. Thus, the N-type epitaxial layer serves as an optical passage to efficiently introduce a light beam into the photo absorbing layer of the photodiode.

20 Claims, 13 Drawing Sheets

5,747,860

1

METHOD AND APPARATUS FOR FABRICATING SEMICONDUCTOR DEVICE WITH PHOTODIODE

BACKGROUND OF THE INVENTION

1. Field of the Invention

The present invention relates to a method and an apparatus for fabricating a semiconductor device having a photodiode. More specifically, the invention relates to a method and an apparatus for fabricating a semiconductor device with a photodiode which is formed on a Si substrate and can improve introduction efficiency of light for a photo absorbing layer.

2. Description of the Related Art

Conventionally, a semiconductor device employing a silicon is applied for photo detection. Since a photo-detector employing a silicon detects only light having wavelength less than 1 µm, it is not possible to be applied for receiving a light having a wavelength of 1.3 µm band to be employed in a optical fiber communication of relatively long distance. Therefore, for receiving the light in the 1.3 µm band, a photo-detector formed with a compound type semiconductor has been employed.

For instance, by employing SiGe having a sensitivity for the light in the 1.3 µm band in a photo absorbing layer of a photodiode, a photodiode applicable for the light of the 1.3 µm band can be obtained through inexpensive silicon process. Such photo-detector employing SiGe has been reported in V. P. Kesan et al., 1990 International Electron Device Meeting Technical Digest, pp. 637 to 640, for example. Hereinafter, this photo-detector will be referred to as first prior art.

FIG. 1 is a section showing a construction of the photo-detector of the first prior art. A silicon oxide layer 62 and N-type epitaxial layer 63 are formed in order on a P-type silicon substrate 61. A Si/SiGe superlattice layer 64 is formed on the N-type epitaxial layer 63, and $P^+$ type epitaxial layer 65 is formed over the Si/SiGe superlattice layer 64. Then, the Si/SiGe superlattice layer 64 and the $P^+$ type epitaxial layer 65 are etched into mesa shaped configuration to form a photodiode portion 67 of a photo-detector. On the other hand, the Si/SiGe superlattice layer 64 and the $P^+$ type epitaxial layer 65 are removed by etching to form an optical waveguide region 66. Therefore, the N-type epitaxial layer 63 is exposed in an optical waveguide region 66. The exposed N-type epitaxial layer 63 is further etched to form a rib shaped optical waveguide 66a.

On the other hand, another construction of the photo-detector has been reported in A. Splett, et al., IEEE Photonics Technology Letters, Vol. 6, January, 1994, pp 59 to 61. Hereinafter, this photo-detector will be referred to as second prior art.

FIG. 2 is a section showing a construction of the photo-detector in accordance with the second prior art. P-type epitaxial layer 72 is formed over a P-type silicon substrate 71. On the P-type epitaxial layer 72, a Si/SiGe superlattice layer 73 is formed, and $N^+$ type epitaxial layer 74 is formed thereover. Then, the Si/SiGe superlattice layer 73 and the $N^+$ type epitaxial layer 74 are etched into mesa shaped configuration to form a photodiode portion 77 of a photo-detector. On the other hand, the Si/SiGe superlattice layer 73 and the $P^+$ type epitaxial layer 74 are removed by etching to form an optical waveguide region 75. Therefore, the N-type epitaxial layer 72 is exposed in an optical waveguide region 75. The exposed N-type epitaxial layer 72 is further etched to form a rib shaped optical waveguide 75a.

2

In these photo-detectors, after growing the photo absorbing layer (superlattice layers 64 or 73), in which Si and SiGe are alternately overlaid or stacked on P-type or N-type optical waveguide 66a or 75a, and further growing a high concentration impurity regions ($P^+$ type epitaxial layer 65 or $N^+$ type epitaxial layer 74) to be an electrode is formed thereover, etching is performed to shape into mesa shaped configuration to form the photodiode portion 67 and 77.

Normally, since lattice constants are different in Si and SiGe, it is generally not possible to grow the SiGe layer over the Si layer in sufficient thickness. However, since the total layer thickness of SiGe is approximately several hundreds nm at the most, absorption efficiency becomes low when the light incides through the upper surface of the photodiode to cause lowering of sensitivity.

Accordingly, with respect to the superlattice layer stacking in vertical direction, light has to incide in lateral direction.

On the other hand, in the photo-detectors of the first and second prior arts, when light indices from light incidence planes 68 or 78, the light passes the optical waveguide 66a or 75a to reach the photodiode portion 67 or 77. Then, by energy of the light inciding into the superlattice layer 64 or 73 from the lower side of the superlattice layer 64 or 73, a current is generated.

In general, a core diameter of an optical fiber is approximately 10 µm, and with respect to this, the Si/SiGe superlattice layer as the photo absorbing layer is thin. Accordingly, in the photo-detector in the first and second prior arts, by providing optical waveguide 66a or 75a in the length of several hundreds µm to several mm between the incidence planes 68 or 78 of the light from the optical fiber to photodiode portions 67 or 77 to form evanescent wave coupling for the photo absorbing layer (superlattice layers 64, 73). Thus, since the beam shape of the light incides from the optical fiber is stably enclosed in the optical waveguide to improve photo absorbing efficiency in the photodiode portions 67 or 77.

However, in the photo-detectors in the first and second prior arts, since the Si/SiGe layers are formed into mesa type, recombination level is easily generated in the end faces 67a or 77a to potentially cause leak current in the diode portions 67 or 77. This leak current becomes dark current of the photodiode to significantly lower characteristics of the photo-detector. Also, in order to improve photo absorbing efficiency, it becomes necessary to make the thickness of Si/SiGe superlattice layer about 700 µm. It is difficult to assemble the photo-detector having such a large step with other integrated circuit. Furthermore, since the optical fiber is located out of the chip, a further problem is encountered in difficulty of precisely fixing the optical fiber to the photo-detector.

SUMMARY OF THE INVENTION

It is the first object of the present invention to provide a semiconductor device having a photodiode which can efficiently introduce a light beam into a photo absorbing layer of the photodiode with small dark current.

The second object of the present invention is to provide a semiconductor device having a photodiode which permits to obtain optimal diode area and integration, and can improve a photo response speed.

The third object of the present invention is to provide a semiconductor device having a photodiode which is easy to couple with an optical fiber and can avoid unnecessary stress which is otherwise caused by residual of bond or so forth for coupling.

The fourth object of the present invention is to provide a semiconductor device having a photodiode which can efficiently introduce a light beam into a high speed bipolar transistor and a photo absorbing layer.

The fifth object of the present invention is to provide a fabrication process for a semiconductor device with a photodiode which can easily form an integration circuit of a high speed bipolar transistor and a photodiode efficiently introducing a light beam into a photo absorbing layer.

A semiconductor device having a photodiode, in accordance with the present invention, comprising:

a silicon substrate;

a photodiode formed on the surface of the silicon substrate, which has a photo absorbing layer formed on the surface thereof;

an isolation region for isolation of the photodiode;

an optical waveguide formed on the surface of the substrate adjacent the photodiode across the isolation region. The optical waveguide includes first layer formed on the surface thereof, a second layer formed below the first layer and a third layer formed below the second layer. The first layer and the third layer are formed of materials having smaller refraction index than the second layer. The second layer and the third layer are extended below the photo absorbing layer of the photodiode via the isolation region.

Whereby a light beam inciding into a side surface of the second layer is lead beneath the photo absorbing layer along the second layer.

In the semiconductor device set forth above, the photodiode may have a planar structure. On the other hand, the first layer is preferably formed with a silicon oxide layer, the second layer is formed with an N-type epitaxial layer, and the third layer is higher concentration epitaxial layer having higher concentration than the N-type epitaxial layer. The photodiode also has a lower electrode lead layer, and the high concentration epitaxial layer is formed at least a part of the lower electrode lead layer. On the other hand, the second and third layers may be formed with a silicon on insulator layer. Also, photo absorbing layer may be formed with a Si/SiGe superlattice layer which is arranged in parallel to the surface of the silicon substrate.

The semiconductor device with a photodiode may further comprise an optical fiber fixing trench formed on the surface of the silicon substrate, the end face of the trench forming a side surface of the second layer, whereby the light beam output from the optical fiber fixed to said trench incides to said second layer through the end face of said trench. The semiconductor device with a photodiode may also comprise a bond injecting trench formed to be connected to the optical fiber fixing trench. Preferably, the semiconductor device with a photodiode has an end face perpendicular to the optical fiber fixing trench, and the bond injecting trench is formed to reach the end face from the optical fiber fixing trench.

The semiconductor device with a photodiode may further comprise a first regions formed at both sides of the light beam passing through the optical waveguide, and the first region is formed of a material having lower refraction index than the second layer. In this case, the first region may be formed with a silicon oxide layer and formed to reach the third layer from the surface of the first layer.

The first region may be formed such that two first regions defines the optical waveguide narrowing toward the traveling direction of the light beam. The photo absorbing layer may be formed into a configuration to radially widened from the optical waveguide within a surface parallel to the silicon substrate.

The semiconductor device with a photodiode may also comprise a second regions formed at both sides of the light passing through the photodiode, the second region is formed of a material having lower refraction index than the second layer.

Another semiconductor device having a photodiode, in accordance with the present invention, comprises:

a first conductive type silicon substrate;

a photodiode formed on the surface of the silicon substrate, which has a photo absorbing layer formed on the surface thereof;

an isolation region for isolation of the photodiode;

an optical waveguide formed on the surface of the substrate adjacent the photodiode across the isolation region; and a bipolar transistor formed on the silicon substrate adjacent the photodiode across the isolation region. The optical waveguide includes a second conductive type second epitaxial layer formed on the surface thereof, a second conductive type first epitaxial layer formed below the second epitaxial layer and a second conductive type first buried layer formed below the first epitaxial layer. The second epitaxial layer and the first buried layer are formed of materials having smaller refraction index than the first epitaxial layer. The first epitaxial layer and the first buried layer are extended below the photo absorbing layer of the photodiode via the isolation region.

And the second epitaxial layer, the first epitaxial layer and the first buried layer are extended toward the bipolar transistor across the isolation region. The bipolar transistor has a second buried layer formed between the second epitaxial layer and the first epitaxial layer.

The semiconductor device with a photodiode as set forth above, may further comprise a lower electrode lead layer reaching the first epitaxial layer from the surface of the second epitaxial layer, and the photodiode may have a third epitaxial layer formed below the photo absorbing layer. The third epitaxial layer may be formed within the second epitaxial layer or formed in contact with the first epitaxial layer.

A fabrication process for a semiconductor device with a photodiode, according to the present invention, comprises:

a step of forming a second conductive type first buried layer on a first conductive type silicon substrate;

a step of forming a second conductive type first epitaxial layer on the first buried layer;

a step of selectively forming a second conductive type second buried layer on the first epitaxial layer;

a step of forming a second conductive type second epitaxial layer on the first epitaxial layer and the second buried layer;

a step of forming an isolation region reaching the silicon substrate from the surface of the second epitaxial layer for isolating a region where the second buried layer is formed from a region where the second buried layer is not formed;

a step of forming a bipolar transistor in the region where the second buried layer is formed;

a step of selectively forming a recess toward inside from the surface of the second epitaxial layer, in the second epitaxial layer on the first epitaxial layer in the region where the second buried layer is not formed;

a step of forming a silicon oxide layer on the side face of the recess; and a step of forming a photo absorbing layer within the recess.

The fabrication process for a semiconductor device with a photodiode may further comprise:

a step of selectively forming a third epitaxial layer within the recess; and a step of forming a lower electrode lead layer reaching the first epitaxial layer from the surface of the second epitaxial layer on the first epitaxial layer.

In the present invention, the optical waveguide consisted of the first layer, the second layer below the first layer and the third layer below the second layer is formed on the surface of the silicon substrate, and the first and third layers are formed of materials having lower refraction index than the second layer. Therefore, the incident light inciding in the second layer is efficiently introduced into the lower portion of the photo absorbing layer via the isolation layer. Accordingly, the externally inciding light is efficiently introduced into the photo absorbing layer of the photodiode by evanescent wave coupling. Also, by surrounding the photo absorbing layer with the silicon oxide layer and so forth, loss of the light beam from the side surface of the photo absorbing layer can be prevented. Namely, by assembling the optical waveguide within the semiconductor device, the photo-detector having optical waveguide with completely planar type can be formed to efficiently absorb the incident light from the optical fiber in the photo absorbing layer.

On the other hand, in the present invention, by forming the first regions of a material having lower refraction index than the second layer, spreading of the incident light beam in the horizontal direction can be suppressed. By this, it becomes unnecessary to make the photo absorbing layer of the photodiode wider to restrict increasing of the junction area to prevent lowering of the photo response speed. Furthermore, when the first region is formed to narrow the optical waveguide toward the traveling direction of the light beam, the incident light can be restricted the path in the narrower area to permit further narrower width of the photodiode to improve photo response speed.

On the other hand, in the present invention, the photo absorbing layer of the photodiode is spread radially toward the traveling direction of the light in the plane parallel to the silicon substrate, and preferably in the equal angle to the spread angle of the light beam in the lateral direction. Thus, light loss or occurrence of the region of the photodiode not contributing with absorption of the light beam can be successfully avoided to optimize the area of the photodiode.

Furthermore, in the lower side of the photo absorbing layer, when second region of the material having refraction index lower than the second layer is formed at both sides of the light passing through the photodiode, it becomes possible to enclose the light beam in the lateral direction even with narrower photo absorbing layer to improve photo absorbing efficient.

Furthermore, in the present invention, when the optical fiber fixing trench for fixing the optical fiber is formed, the optical fiber can be easily fixed on the semiconductor device. Also, it is possible to form the bond injection trench in a manner to be connected to the optical fiber fixing trench. By this, injection of the bond becomes easier. Also, by extending the bond injection trench to the end face of the semiconductor device, excessive amount of the bond can be discharged externally to prevent exertion of stress on the semiconductor device by residual bond. In case of the integration circuit with coexisting the bipolar transistor and the photodiode, only in the bipolar transistor portion, the buried layer may be formed at the intermediate portion of the epitaxial layer. Thus, shallow junction high speed bipolar transistor and the photodiode having the optical wave guide can be formed on the same chip. Namely, the photo-detector and the bipolar integration circuit can be formed on one chip.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The preferred embodiments of the present invention will be concretely discussed hereinafter with reference to the accompanying drawings, particularly to FIGS. 3 to 18G. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
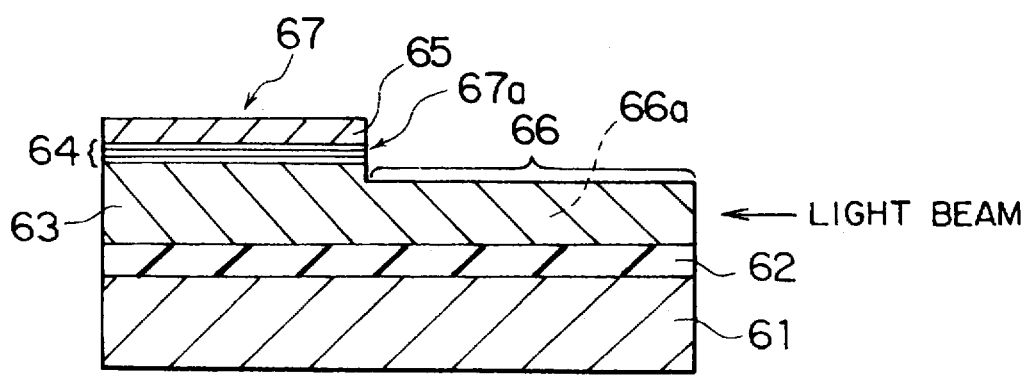
FIG. 1 is a section showing a construction of a photo-detector of the first prior art.
Figure 2:
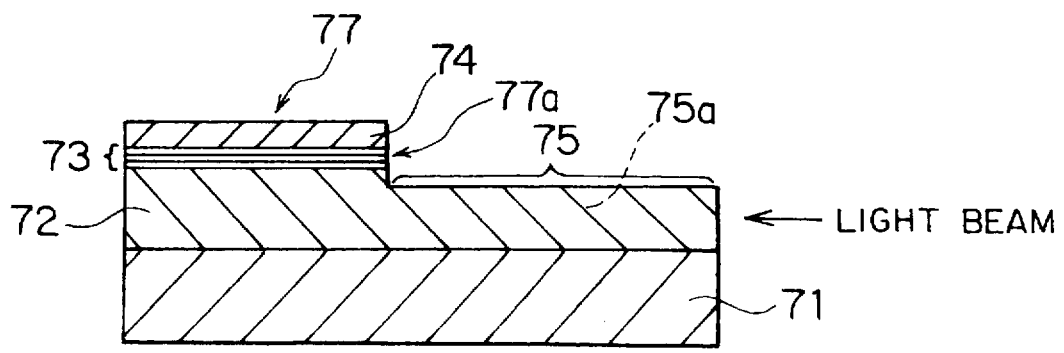
FIG. 2 is a section showing a construction of a photo-detector of the second prior art.
Figure 3:
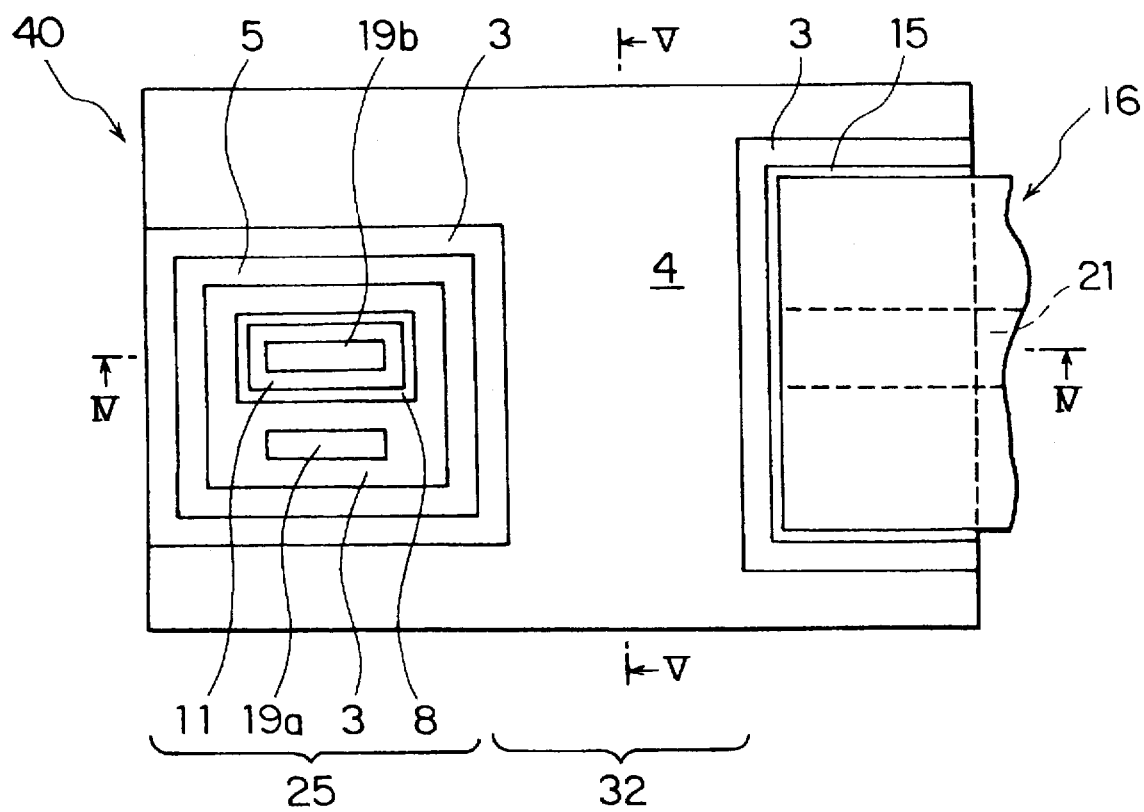
FIG. 3 is a plan view of the first embodiment of a semiconductor device with a photo-detector according to the present invention.
Figure 4:
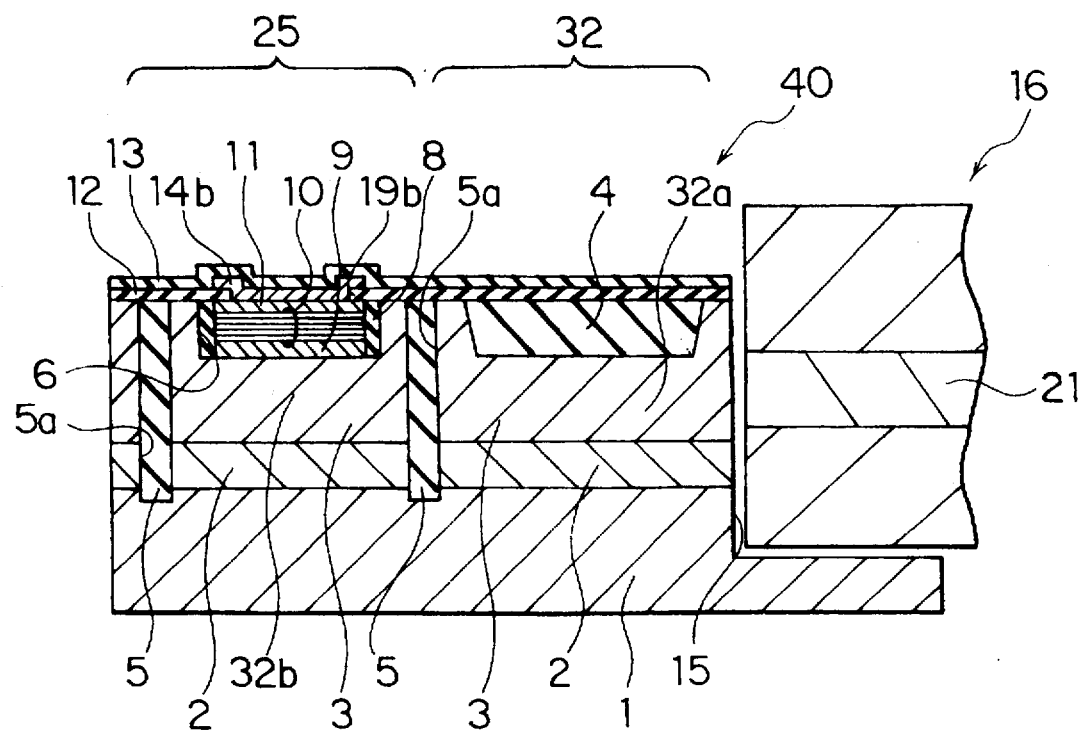
FIG. 4 is a section taken along line IV—IV of FIG. 3.
Figure 5:
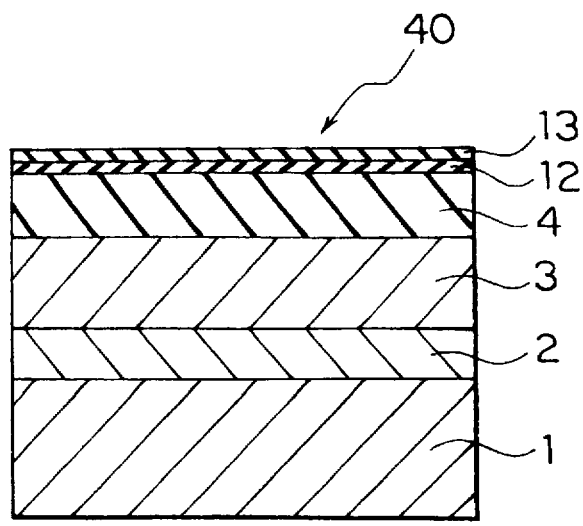
FIG. 5 is a section taken along line V—V of FIG. 3.

FIG. 3 is a plan view of the first embodiment of a semiconductor device having a photodiode according to the present invention, FIG. 4 is a section taken along line IV—IV of FIG. 3 and FIG. 5 is a section taken along line V—V of FIG. 3. It should be noted that, in FIG. 3, a silicon oxide layer, a silicon nitride layer and an aluminum electrode and so forth formed in the vicinity of the surface of the semiconductor device are omitted for the purpose of illustration.

As shown in FIGS. 3 to 5, a semiconductor device 40 is fabricated by forming a photodiode 25, an optical waveguide 32 and an optical fiber fixing trench 15 on the surface of a P-type silicon substrate 1.

In the photodiode 25, on the P-type silicon substrate 1 an $N^+$ type buried layer (third layer) 2 and an N-type epitaxial layer (second layer) 3 are formed in order. On the other hand, a trench 5a reaching the silicon substrate 1 from the surface of the N-type epitaxial layer 3 is formed. In this trench 5a, an insulative material, such as a silicon oxide or so forth is filled to form an isolation region 5. Accordingly, the photodiode 25 is defined by the isolation region 5. Toward inside of the N-type epitaxial layer 3 from the surface of the photodiode 25, a rectangular recess 6 is formed selectively. On the side face of the rectangular recess 6, a silicon oxide layer 8 is formed. Also, within a region surrounded by the silicon oxide layer 8, a P-type epitaxial layer 9, a Si/SiGe superlattice layer (light absorbing layer) 10 and $P^+$ epitaxial layer 11 are grown in order.

On the other, in the optical waveguide 32, a LOCOS (LOCal Oxidation Of Silicon) oxide layer (first layer) 4 is formed, thickness of which is substantially equal to the depth of the recess 6 formed in the photodiode 25. Accordingly, between the LOCOS oxide layer 4 and the $N^+$ type buried layer 2, an optical passage 32a of an N-type epitaxial layer 3 is formed.

On the other hand, on the overall surface of the photodiode 25 and the optical waveguide 32, a silicon oxide layer 12 for protecting an element is formed. In a part of the silicon oxide layer 12 at a location aligned with the N-type epitaxial layer 3, in which the recess 6 of the photodiode 5 is not formed, a first contact hole 19a is formed. On the other hand, at a position aligned with the recess 6 of the silicon oxide layer 12, a second contact hole 19b is formed. Furthermore, a first aluminum electrode (not shown) is formed on the upper surface of the silicon oxide layer for electrically connecting to an N-type region (e.g. N-type epitaxial layer 3) via the first contact hole 19a. Similarly, a second aluminum electrode 14b is formed on the upper surface of the silicon oxide layer 12 to be electrically connected to the $P^+$ type epitaxial layer 11 via the second contact hole 19b. Then, a silicon nitride layer 13 is formed for covering overall surfaces of the silicon oxide layer 12, the electrode 14b and so forth.

Also, on one edge at the side of the optical waveguide 32 of the semiconductor device 40, an optical fiber fixing trench 15 for deciding one end of the optical fiber 16 is formed. The width of the optical fiber fixing trench 15 is slightly greater than a diameter of the optical fiber 16 and the depth is slightly greater than the radius of the optical fiber 16. In the shown embodiment, the depth of the optical fiber fixing trench 15 is determined so as to make the height where the core portion 21 of the optical fiber 16 is arranged and the height of the optical passage 32a coincident. Thus, the semiconductor device 40 is a photo-detector for detecting incident light from the optical fiber 16, and the photodiode 25 and the optical waveguide 32 are formed in completely planar structure in the semiconductor device 40.

In the semiconductor device 40 constructed as set forth above, when the light beam from the optical fiber 16 incides in the optical passage 32a, the light beam travels to the isolation region 5 through the optical passage 32a. This light beam is irradiated on the isolation region 5 in substantially perpendicular thereto to reach the photodiode 25 with little attenuation. At this time, the N-type epitaxial layer 3 between the recess 6 formed in the photodiode 25 and the $N^+$ type buried layer 2 performs equivalent function as optical passage 32b as in the optical waveguide 32. The light beam thus reaches the photodiode 25 is introduced into the photo absorbing layer (superlattice layer 10) by the evanescent wave coupling to generate a current by an energy of the light beam.

In the shown embodiment, the optical passage 32a of the N-type epitaxial layer 3 is sandwiched by LOCOS oxide layer 4 and the $N^+$ type buried layer 2. A refraction index of the LOCOS oxide layer 4 is 1.53, and a refraction index of the $N^+$ type buried layer 2 is 3.42, and a refraction index of the N-type epitaxial layer 3 forming the optical passage 32a is 3.3. Therefore, since the refraction index of the optical passage 32a is the greatest, the incident light from the optical fiber can be enclosed in the N-type epitaxial layer 3 to efficiently introduce into the photodiode 25. In the shown embodiment, in the optical passage 32a, since no particular layer for enclosing the light (reflection layer) is provided at both sides with respect to the traveling direction of the light beam, the optical passage 32a is so-called slave type passage.

On the other hand, as shown in the shown embodiment, when the side surfaces of the photo absorbing layer (superlattice layer 10) are surrounded by the silicon oxide layer 8, loss of the light beam from the side surface of the superlattice layer 10 can be avoided.

Next, the fabrication process of the shown semiconductor device 40 will be discussed. FIGS. 6A to 6D are sections showing the fabrication process of the first embodiment of the semiconductor device according to the present invention, illustrating the process steps in order.

Figure 6A:
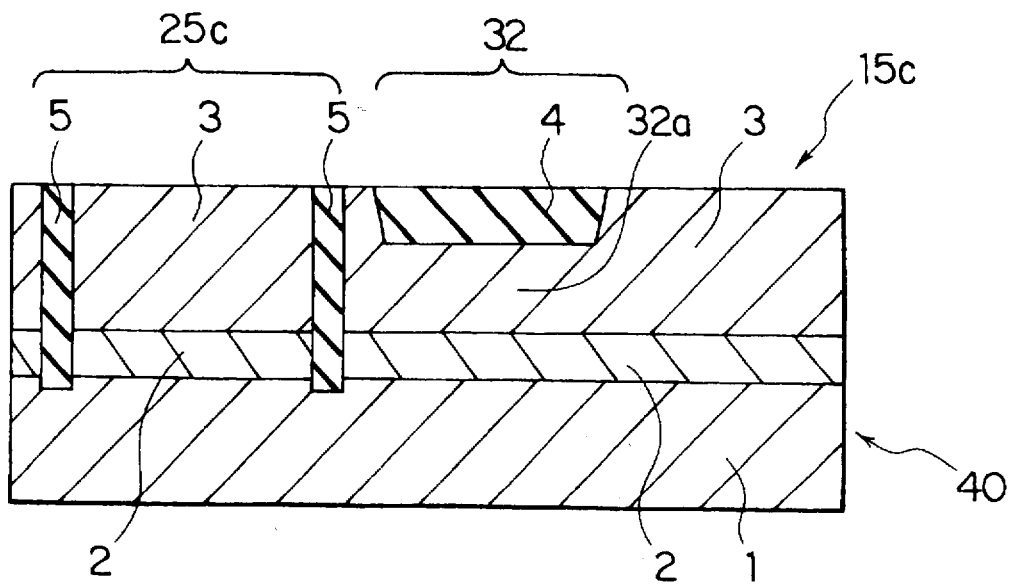
FIGS. 6A to 6D are sections showing fabrication process of the first embodiment of the semiconductor device with the photodiode of the invention, illustrated in the order of process steps.

At first, as shown in FIG. 6A, the $N^+$ type buried layer 2 is formed on the P-type silicon substrate 1, and the N-type epitaxial layer 3 is grown thereover. The N-type epitaxial layer 3 is used as the optical passages 32a and 32b. Therefore, the thickness of the N-type epitaxial layer 3 is set about 3.5 µm, for example. Next, the LOCOS oxide layer 4 is formed over the entire region except for a reserved region for formation of the photodiode (photodiode formation reserved region 25c) and the peripheral portion thereof, and a reserved region for formation of the optical fiber fixing trench (optical fiber fixing trench formation reserved region 15c) and the peripheral portion thereof.

Next, in order to define the photodiode formation reserved region 25c, the trench 5a is formed from the surface of the N-type epitaxial layer 3 to reach the P-type silicon substrate 1. Then, silicon oxide layer and so forth is filled in the trench 5a to form the isolation region 5. The order of formation of the LOCOS oxide layer 4 and the isolation region 5 may be formed earlier. When this semiconductor device is used as photo-detector of 1.3 μm band, the thicknesses of the N⁺ type buried layer 2 and the LOCOS oxide layer 4 are preferred to be greater than or equal to the wavelength (1.3 μm) of the light.

Figure 6B:
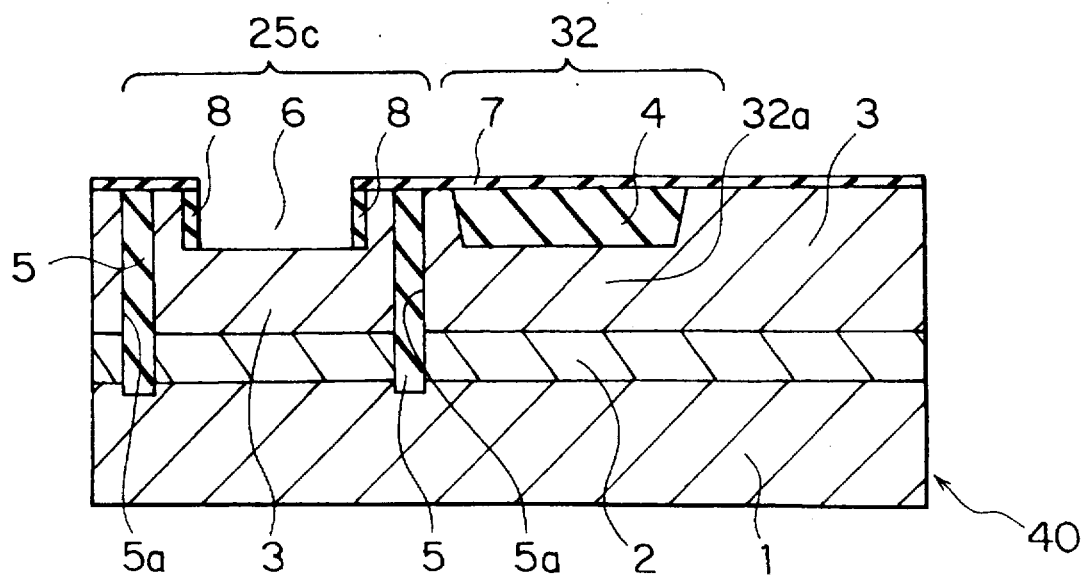

Subsequently, as shown in FIG. 6B, in the N-type epitaxial layer 3 in the photodiode formation reserved region 25c, a generally rectangular recess 6 is formed in a depth of about 1 μm by Si etching, for example. Then, on the side face of the recess 6, the silicon oxide layer 8 is formed. At this time, except for the bottom of the recess 6, the silicon oxide layer 7 is formed on the N-type epitaxial layer 3 and the surface of the LOCOS oxide layer 4.

Figure 6C:
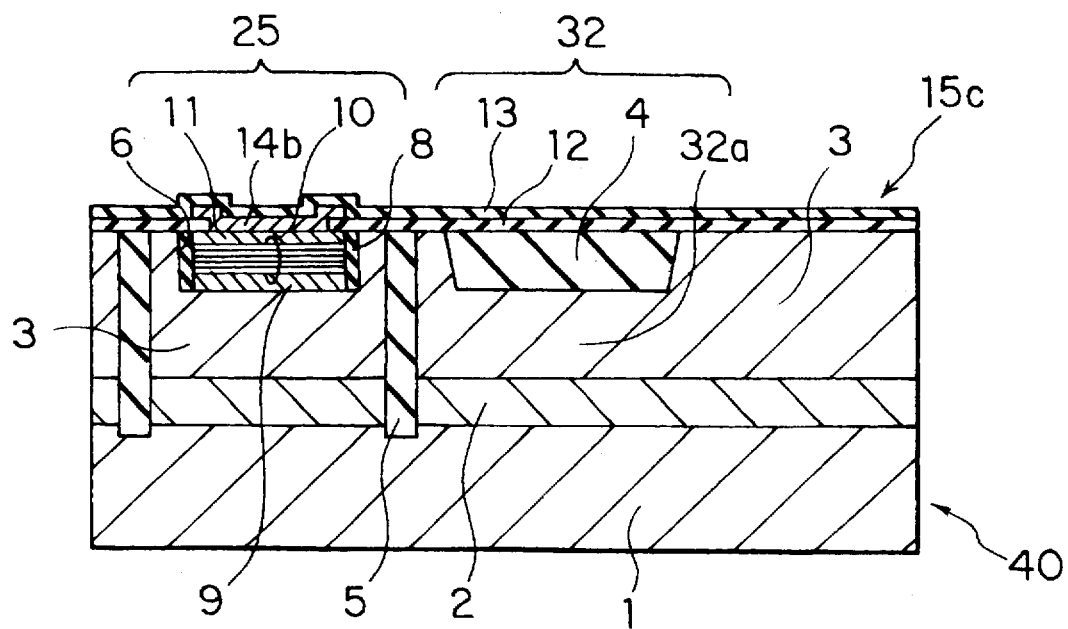

Thereafter, as shown in FIG. 6C, on the N-type epitaxial layer 3 exposed in the bottom surface of the recess 6, the P-type epitaxial layer 9, Si/SiGe superlattice layer 10 and the P⁺ epitaxial layer 11 are sequentially grown selectively, by using the silicon oxide layer 7 as a mask. Next, after removing the silicon oxide layer 7, the silicon oxide layer 12 is formed over the N-type epitaxial layer 3, the LOCOS oxide layer 4, the isolation layer 5 and the P⁺ type epitaxial layer 11.

Then, a first contact hole 19a is formed in a part of the silicon oxide layer 12 at a position aligning with the N-type epitaxial layer 3 where the recess 6 in the photodiode 25 is not formed. On the other hand, a second contact hole 12 is formed in the silicon oxide layer 12 at the position aligning with the recess 6. Thereafter, a first aluminum electrode (not shown) is formed over the silicon oxide layer 12 so as to be connected to the N-type region (for example, the N-type epitaxial layer 3) via the first contact hole. Similarly, the second aluminum electrode 14b is formed over the silicon oxide layer 12 so as to be connected to the P⁺ type epitaxial layer 11 via the contact hole 19b. At this time, in order to connect the first aluminum electrode and the N⁺ type buried layer 2, the N⁺ type lead layer (lower electrode lead layer) may be formed from the surface of the N-type epitaxial layer 3 to reach the N⁺ type buried layer 2. Subsequently, the silicon nitride layer 13 is formed to cover the entire surface of the silicon oxide layer 12, the electrode 14b and so forth.

Figure 6D:
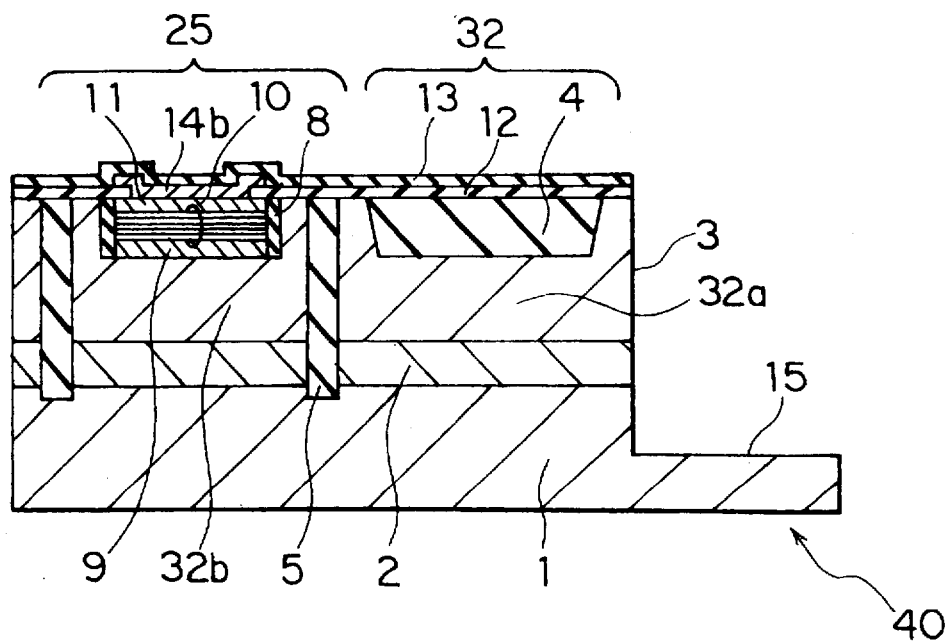

Thereafter, as shown in FIG. 6D, the optical fiber fixing trench 15 is formed by Si etching. When a single mode fiber for 1.3 μm band is employed as the optical fiber 16, since the diameter of the fiber is 125 μm, the optical fiber fixing trench 15 is formed in the depth of about 65 μm so that the trench is slightly greater than the radius of the optical fiber 16. Here, for etching, a thick resist layer and so forth may be used as a mask. Thereafter, by fixing one end of the optical fiber 16 in the optical fiber fixing trench 15 by an epoxy type bond, the semiconductor device 40 with the photodiode is fabricated.

As shown in FIG. 4, when the optical fiber fixing trench 15 is formed so that the height of the core portion 21 of the optical fiber 16 and the height of the optical passage 32a are coincident, the light beam can be introduced into the photodiode 25 more efficiently.

Figure 7:
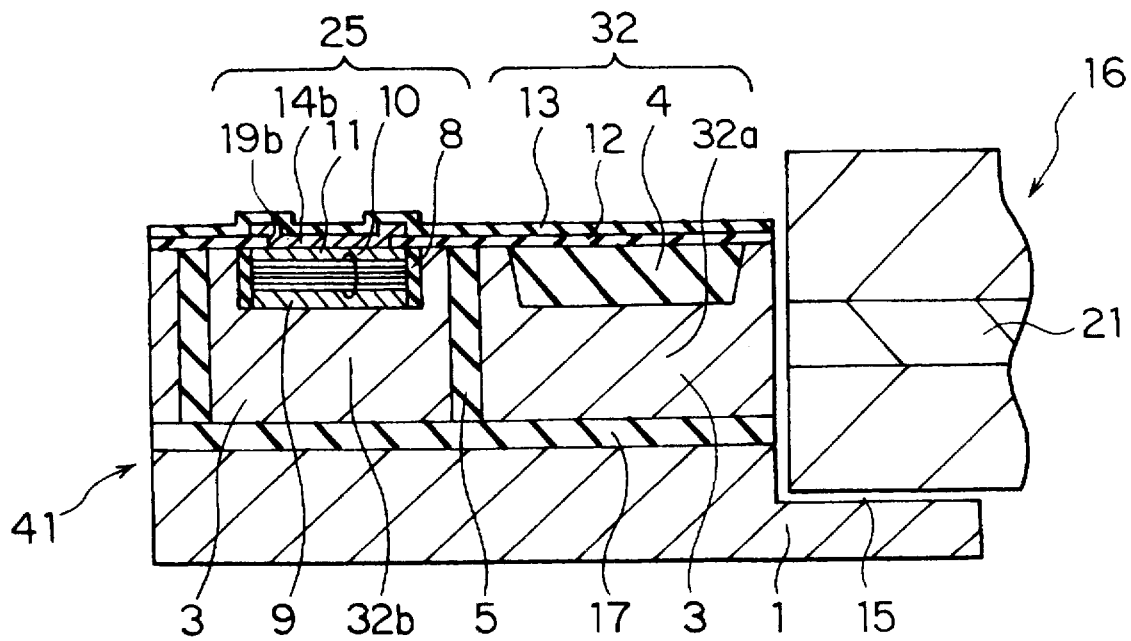
FIG. 7 is a section of the second embodiment of the semiconductor device with the photodiode according to the present invention.

Next, the second embodiment of the present invention will be discussed. FIG. 7 is a section showing the second embodiment of the semiconductor device with the photodiode according to the invention. The second embodiment is differentiated from the first embodiment, in that the SOI (Silicon On Insulator) substrate is employed in replace of the N⁺ type buried layer (high concentration epitaxial layer) 2 and N-type epitaxial layer 3 shown in FIG. 4. Accordingly, in the second embodiment, like elements to the first embodiment will be identified by like reference numerals and detailed description thereof will no be discussed.

In the shown embodiment, so-called SOI substrate, in which silicon is stacked on an insulation layer is employed as a part of the semiconductor device 41. The SOI substrate is constructed with a silicon oxide layer (buried oxide layer) 17 and N-type epitaxial layer (N-type active region) 3. The N⁺ type buried layer 2 shown in the first embodiment corresponds to the silicon oxide layer 17 in the shown embodiment. Accordingly, the optical passage 32a is sandwiched by the LOCOS oxide layer 4 and the silicon oxide layer 17 so that the incident light from the optical fiber 16 may be efficiently reach the photodiode 25 by the oxide layers 4 and 17. It should be noted that, in the shown embodiment, the isolation region 5 is formed from the surface of the N-type epitaxial layer of the SOI substrate to reach the surface of the silicon oxide layer 17.

The semiconductor device 41 is fabricated by initially forming the LOCOS oxide layer (first layer) 4 and the isolation layer 5 similarly to the first embodiment on the surface of the SOI substrate having the silicon oxide layer (third layer) 17 in more than or equal to about 1 μm and the N-type epitaxial layer (second layer) 3 in about 3.5 μm, and subsequently perform similar process to the first embodiment.

In the second embodiment constructed as set forth above, since the SOI substrate is employed, the fabrication process can be simplified in comparison with the first embodiment of the semiconductor device, and the depth of the isolation region 5 can be made shallow. It should be noted that when the N⁺ type buried layer 2 is formed on the silicon substrate 1 similarly to the first embodiment, and the SOI substrate is arranged thereover, the third layer beneath the optical passage 32a can be formed with both of the silicon oxide layer 17 and the N⁺ type buried layer 2. Then, while the fabrication process cannot be simplified, the thickness of the silicon oxide layer 17 can be made thinner than or equal to 500 nm with respect to the light means of the wavelength of 1.3 μm band to minimize the stress to be exerted on the element and to make the isolation region 5 shallow.

Figure 8:
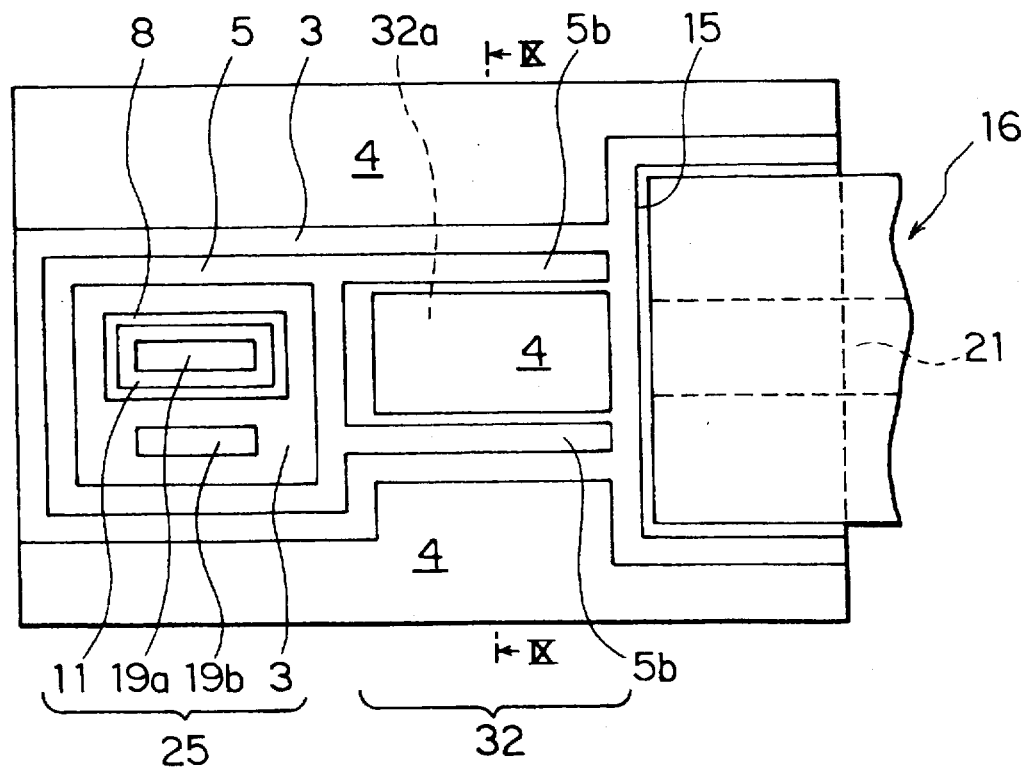
FIG. 8 is a plan view of the third embodiment of the semiconductor device with the photodiode according to the present invention.
Figure 9:
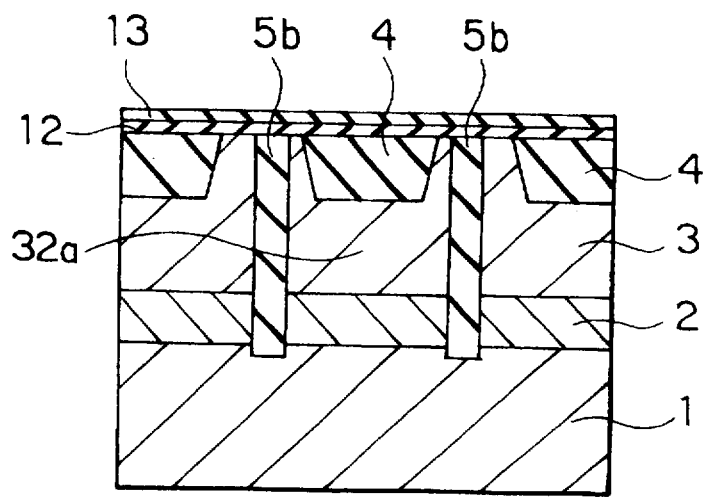
FIG. 9 is a section taken along line IX—IX of FIG. 8.

Next, third embodiment of the present invention will be discussed. FIG. 8 is a plan view of the third embodiment of the semiconductor device with the photodiode according to the present invention. FIG. 9 is a section taken along line IX—IX of FIG. 8. The third embodiment is differentiated from the first embodiment only in that the isolation layer 5 is formed not only for defining the photodiode 25 but also on both sides of the optical passage 32a. Accordingly, in the third embodiment, the like elements to the first embodiment will be identified by like reference numerals and detailed description thereof will no be discussed.

In the third embodiment, on both sides of the optical passage 32a, isolation regions (first regions) 5b from the surface of the N-type epitaxial layer 3 to reach the silicon substrate 1 is formed. Also, the width between the isolation regions 5b at both sides of the optical passage 32a has substantially the same size to the diameter (approximately 10 μm) of the core portion 21 of the optical fiber 16.

The incident light from the optical fiber has a constant incident angle (spread angle) which is generally determined by number of opening of the optical fiber, refraction index of the incident material and so forth. For example, assuming that the incident angle from the optical fiber is about 1.58° when the isolation regions 5b are not formed on both sides of the optical passage 32a, the incident light travels with spreading in this angle within the optical passage 32a. When the length of the optical passage 32a extends over several hundreds μm, the spread of the light beam becomes significant to cause necessity to widen the photodiode 25 for absorbing all of the light beam.

In the third embodiment, in addition to the LOCOS oxide layer (first layer) 4 and the N⁺ type buried layer (third layer) 2 on upper and lower sides of the optical passage 32a of the N-type epitaxial layer (second layer) 3, the isolation regions (first regions) 5b are formed at both sides to prevent the light beam from spreading of the traveling light beam toward both sides. Accordingly, it is not required to widen the photo absorbing layer in the photodiode 25 to further efficiently introduce the light beam into the photo absorbing layer (superlattice layer 10). Thus, photo response operation speed may not be lowered by increasing of the combination capacity of the photodiode.

When the light beam of the wavelength of 1.3 µm is used, the thickness of the isolation regions 5b at both sides of the optical passage 32a is required to be slightly longer than the wavelength of the light beam, and thus should be approximately 1.5 µm, for example. On the other hand, as a material to be filled in the isolation regions 5a and 5b, one having lower refraction index than the N-type epitaxial layer 3 forming the optical passage 32a, e.g. silicon oxide layer, may be used.

Figure 10:
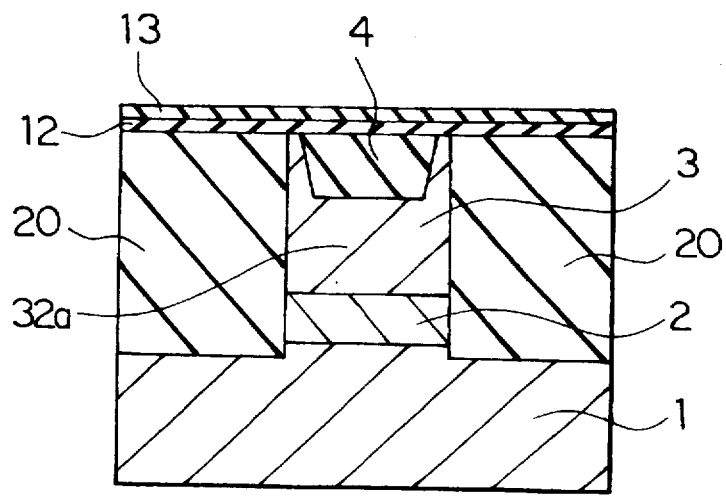
FIG. 10 is a section showing a modification of the third embodiment of the semiconductor device of the invention.

FIG. 10 is a section showing a modification of the third embodiment of the present invention. In the shown embodiment, all of the N⁺ type buried layer 2 and N-type epitaxial layer 3 in the regions other than the photodiode 25 and the optical passage 32a are formed of silicon oxide layer 20. Accordingly, the silicon oxide layer 20 at both sides of the optical passage 32a serves as isolation region 5b. By surrounding the optical passage 32a with the LOCOS oxide layer (first layer) 4, the N⁺ type buried layer (third layer) 2 and the silicon oxide layers (first region) 20, the light beam can be enclosed within the optical passage 32a further completely.

Figure 11:
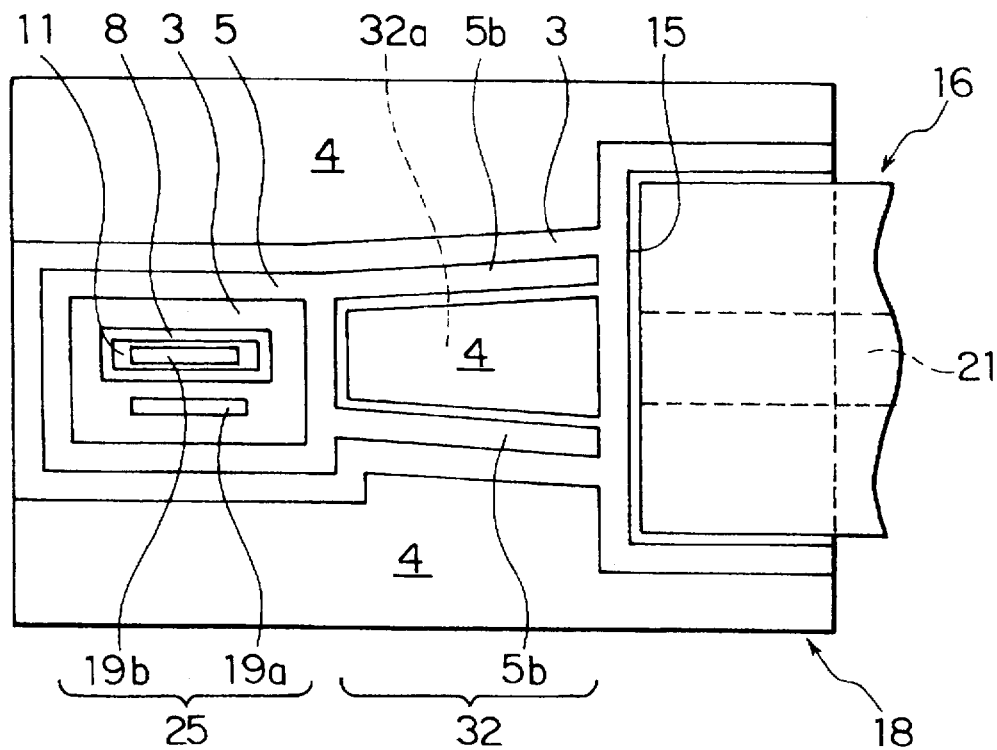
FIG. 11 is a plan view showing the fourth embodiment of the semiconductor device with the photodiode according to the invention.

Next, the fourth embodiment will be discussed. FIG. 11 is a plan view showing the semiconductor device with the photodiode according to the present invention. It should be noted that, in FIG. 11, silicon oxide layer, silicon nitride layer and aluminum electrode and so forth are omitted for the purpose of illustration. The fourth embodiment is differentiated from the third embodiment only in the position where the isolation 5b is formed. Accordingly in the fourth embodiment, like elements to the third embodiment will be identified by like reference numerals and detailed description thereof will no be discussed.

In the fourth embodiment, the distance between the isolation regions 5b at both sides of the optical passage 32a is gradually decreased to form a tapered shape from the side of the optical fiber fixing trench 15 toward the photodiode 25.

In the fourth embodiment constructed as set forth above, since the incident light from the optical fiber 16 can be converged in a further narrower range, the width of the photo absorbing layer of the photodiode 25 can be made narrower in comparison with the third embodiment. Accordingly, since the combination capacity of the diode can be made smaller, the fourth embodiment is particularly suitable for photo-detector which is required high photo response operation speed.

Figure 12A:
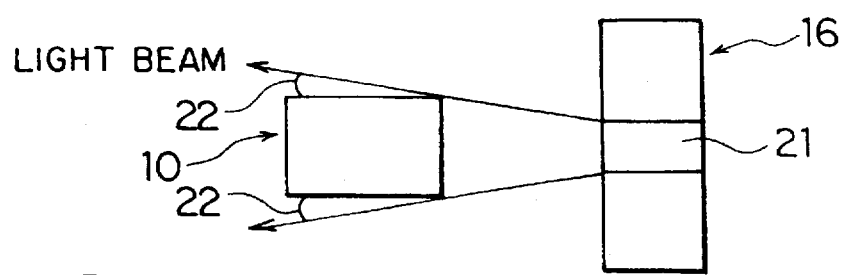
FIGS. 12A and 12B are diagrammatic illustrations showing traveling direction of incident light from a core of an optical fiber.
Figure 12B:
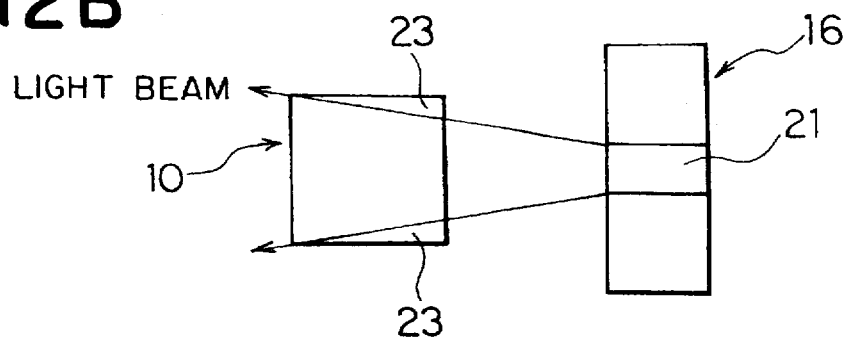
Figure 13:
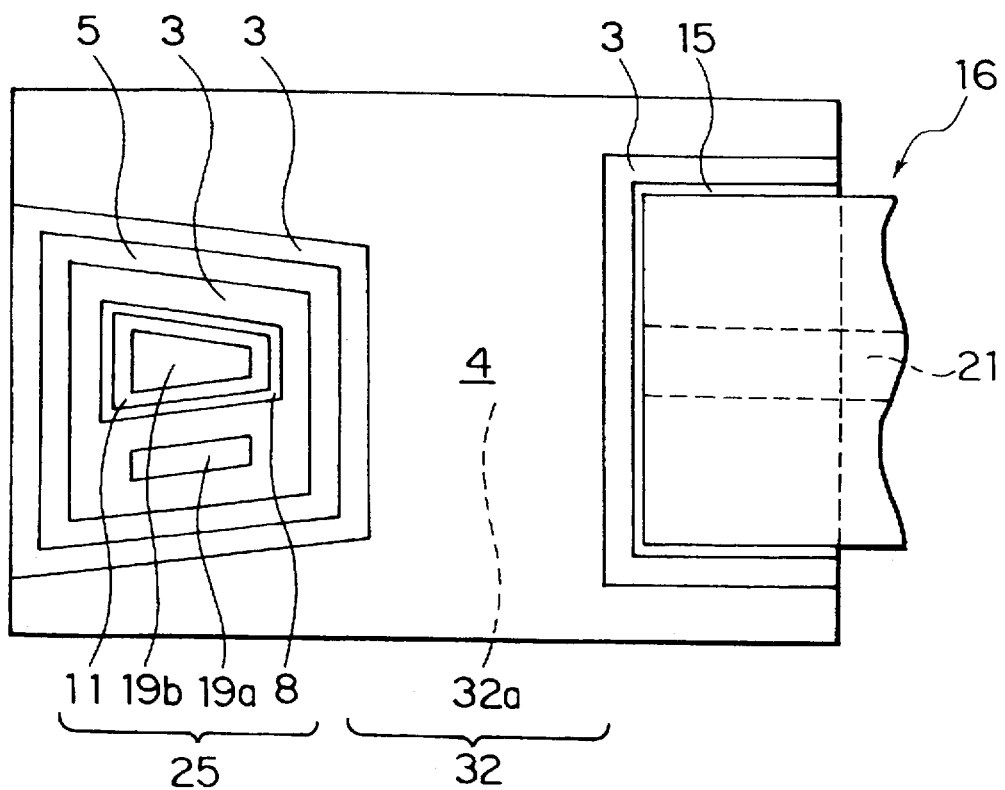
FIG. 13 is a plan view showing the fifth embodiment of the semiconductor device with the photodiode according to the invention.

Next, fifth embodiment of the invention will be discussed. FIGS. 12A and 12B are diagrammatic illustration of the traveling direction of the incident light from the core portion of the optical fiber, and FIG. 13 is a plan view showing the fifth embodiment of the semiconductor device with the photodiode according to the present invention. It should be noted that, in FIG. 13, silicon oxide layer, the silicon nitride layer, aluminum electrode and so forth are omitted. Also, the fifth embodiment is differentiated from the first embodiment only in the configuration of the photodiode 25. In the fifth embodiment, like elements to those in the first embodiment will be identified by like reference numerals and detailed description thereof is neglected.

As shown in FIG. 12A, after inciding into the semiconductor device from the core portion 21 of the optical fiber 16, the light is introduced into the photo absorbing layer (superlattice layer 10). At this time, for improving the photo absorbing efficiency via evanescent wave coupling, it becomes necessary to extend the length of the photo absorbing layer (superlattice layer 10) in the traveling direction of the light beam in the extent of several hundreds µm. In this case, assuming that the incident angle of the light beam is 1.58°, light beam is spread into fan shaped configuration from the core portion 21 (generally, 10 µm in diameter) of the optical fiber 16 to reach the photodiode. Therefore, for example, as shown in FIG. 12A, a part of the light beam can be out of the photo absorbing layer (superlattice layer 10) to cause optical loss 22.

On the other hand, as shown in FIG. 12B, when the photo absorbing layer (superlattice layer 10) is preliminarily widened for avoiding the light loss 22, a region which does not contribute for absorption of the light beam (non-absorbing diode region 23) can be created within photo absorbing layer.

As shown in FIG. 13, in the fifth embodiment, corresponding to the incident angle of the light beam from the optical fiber 16, the photodiode 25 and the photo absorbing layer and so forth are formed radially in the similar angle.

In the fifth embodiment constructed as set forth above, the light beam can be efficiently introduced without increasing the area of the photo absorbing layer. On the other hand, since the light loss 22 and non-absorbing diode region 23 may not be caused, it is not possible to unnecessarily increase the combination capacity to lower response to the light beam. As shown in FIG. 13, the radially shaped photodiode 25 and the photo absorbing layer (not shown) adapting to spread of the light is applicable for the second to fourth embodiments of the present invention. By combining these, the semiconductor device which can further efficiently detect the light can be obtained.

Figure 14:
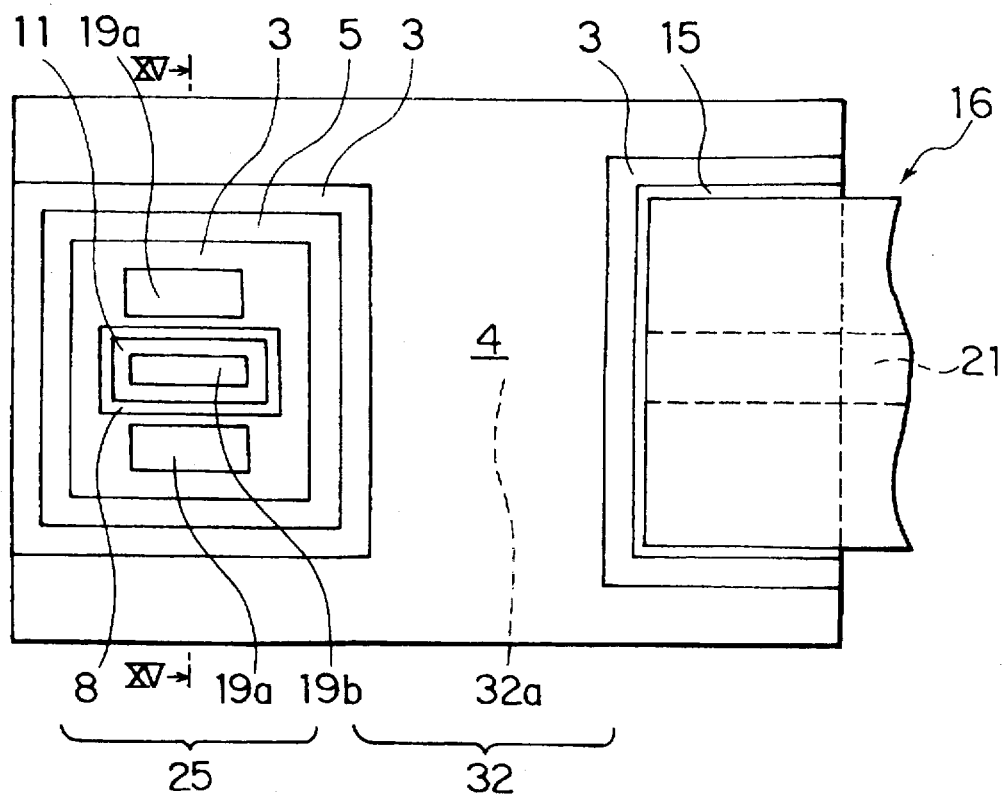
FIG. 14 is a plan view showing the sixth embodiment of the semiconductor device with the photodiode according to the invention.
Figure 15:
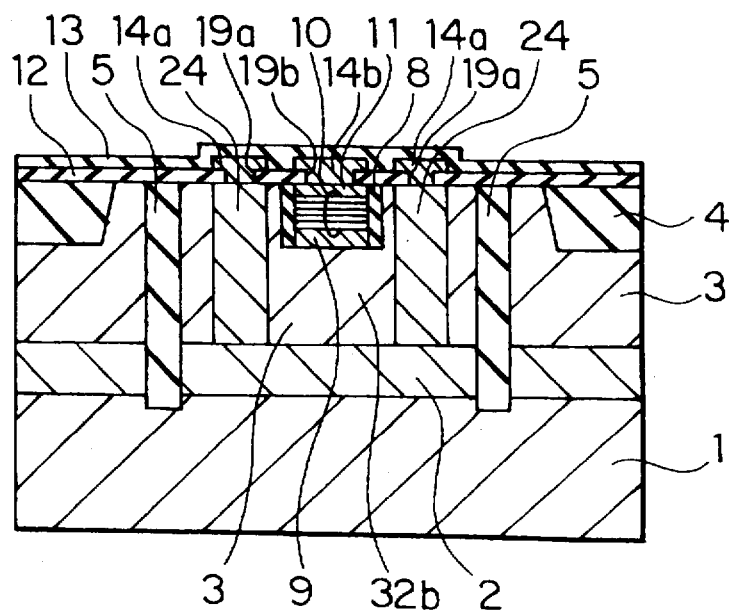
FIG. 15 is a section taken along line XV—XV of FIG. 14.

Next, the sixth embodiment of the present invention will be discussed. FIG. 14 is a plan view showing the sixth embodiment of the semiconductor device with the photodiode according to the present invention, and FIG. 15 is a section taken along line XV—XV of FIG. 14. It should be noted that, in FIG. 14, silicon oxide layer, the silicon nitride layer, aluminum electrode and so forth are omitted. Also, the sixth embodiment is differentiated from the first embodiment only in that the N⁺ type lead layer (second region) 24 are formed at both sides of the traveling direction of the light beam in the photodiode 25. In the fifth embodiment, like elements to those in the first embodiment will be identified by like reference numerals and detailed description thereof is neglected.

The first to fifth embodiments are adapted to efficiently introduce the light beam from the optical fiber 16 into the photodiode 25 by forming the optical passage 32a. However, even in the photodiode, the sensitivity in detecting the light beam can be further improved by restricting spreading of the light beam toward both transverse sides relative to the traveling direction of the light beam. In the first to fifth embodiments, in consideration of the fact that the N-type epitaxial layer 2 serves as the optical passage 32b beneath the photo absorbing layer, the isolation region 5 similarly to the third embodiment may be employed for restricting lateral spreading of the light beam toward lateral sides in the photodiode 25.

However, in practice, in the photodiode 25, it is inherent to provide the first contact hole 19a laterally adjacent the photo absorbing layer of the photodiode for extending the lower electrode (electrode for applying voltage to the N-type epitaxial layer 3 or the N$^+$ type buried layer 2). Therefore, the isolation region 5 is inherently present away from the photo absorbing layer of the photodiode. Consequently, it is not the optimal method to employ the isolation region 5 as a region for restricting spreading of the light beam.

In the sixth embodiment, adjacent both sides of the photo absorbing layer of the photodiode 25, N$^+$ lead layers 24 is formed to reach the N$^+$ type buried layer 2 from the surface of the N-type epitaxial layer 3.

In the sixth embodiment constructed as set forth above, the N$^+$ lead layers 24 has smaller refraction index than that of the N-type epitaxial layer 3. Therefore, the N$^+$ lead layers 24 can be employed as a region for restricting spreading of the light beam toward the lateral side and thus can efficiently enclose the light beam between the N$^+$ lead layers 24. The N$^+$ lead layers 24 are in contact with the first aluminum electrodes 14a via the first contact hole 19a.

Figure 16:
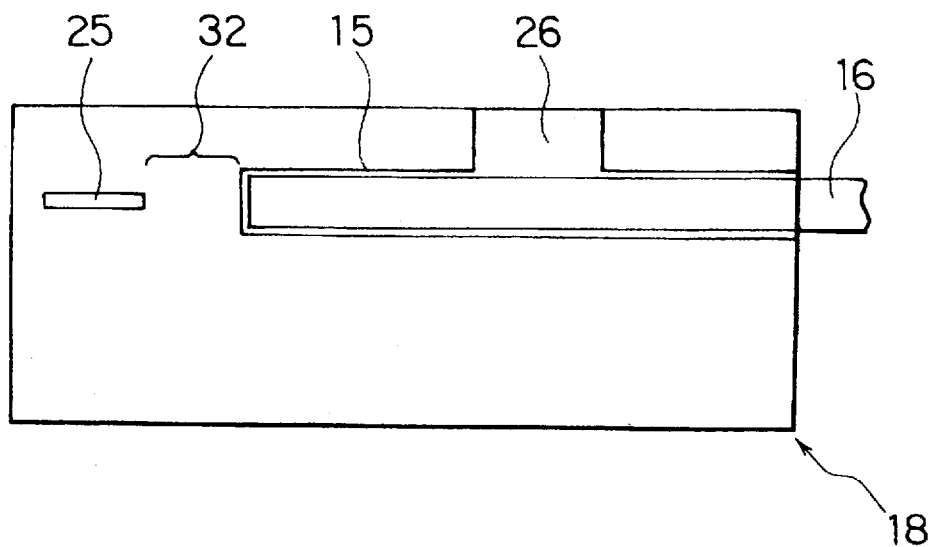
FIG. 16 is a diagrammatic plan view showing an optical fiber 16 fixed to a semiconductor device 18 in the seventh embodiment of the semiconductor device with the photo-diode according to the invention.

Next, seventh embodiment of the present invention will be discussed. FIG. 16 is a diagrammatic plan view showing the optical fiber 16 fixed to the semiconductor device 18, in the seventh embodiment of the semiconductor device with the photodiode according to the invention.

In the first to sixth embodiments, an epoxy type bond is employed for fixing one end of the optical fiber in the optical fiber fixing trench 15. However, it is relatively difficult to appropriately inject the epoxy type bond into the optical fiber fixing trench 15.

In the seventh embodiment, on the surface of the semiconductor device, a bond injecting trench 26 is formed in such a manner that the bond injecting trench 26 is connected to a part of the optical fiber fixing trench 15. In the seventh embodiment constructed as set forth above, the bond can be fed into the optical fiber fixing trench 15 via the bond injecting trench 26 by injecting the bond into the bind injecting trench 26. Therefore, the process step for injecting bond into the optical fiber fixing trench 15 can be facilitated.

On the other hand, as shown in FIG. 16, when the bond injecting trench 26 is extended from the optical fiber fixing trench 15 to the end of the semiconductor device 18, the extra amount of the bond may flow out therethrough, easily. Therefore, it becomes possible to avoid application of a large stress to the semiconductor device 18 by residual bond. The diameter of the optical filer of the single mode is generally 125 μm, the bond injection trench 26 may be formed easily by widen a part of the side of the optical fiber fixing trench 15 to have a width of approximately 100 to 200 μm.

Figure 17:
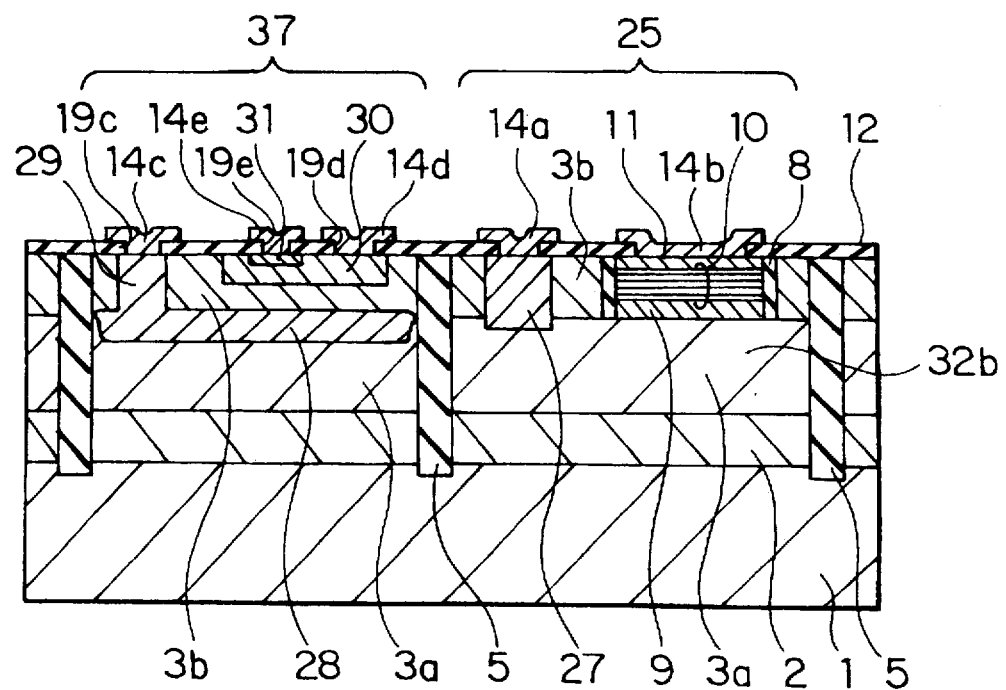
FIG. 17 is a section showing the eighth embodiment the semiconductor device with the photodiode according to the invention.

Next, the eighth embodiment of the invention will be discussed. FIG. 17 is a section showing the eighth embodiment of the semiconductor device with photodiode according to the invention. In the shown embodiment, both of the photo-detector and the bipolar transistor integrated circuit coexists to form the one-chip photo-receiving integration circuit. In the eighth embodiment, like elements to the first embodiment will be identified by like reference numerals. The discussion for these elements will be neglected.

In the first to seventh embodiments, since the optical passage 32b is also formed beneath the photo absorbing layer in the photodiode 25. Therefore, in order to improve light combining efficiency, the optical passage 32b should have a thickness of 2 to 3 μm. Accordingly, it becomes necessary to make the N-type epitaxial layer 3 relatively thick. On the other hand, the high speed bipolar transistor has been developed for making the depth of the junction shallow for speeding. In the recent years, the transistor is formed within the N-type epitaxial layer of less than or equal to 1 μm.

As shown in FIG. 17, in the shown embodiment, in order to form the photo--detector and the bipolar transistor in the same semiconductor device, the N-type epitaxial layer is formed into two layer structure. Namely, in a bipolar transistor 37, by forming a second N$^+$ type buried layer 28 in the intermediate layer portion of the N-type epitaxial layer 3, the lower N-type epitaxial layer (first epitaxial layer) 3a and the upper N-type epitaxial layer (second epitaxial layer) 3b are separated.

In the shown embodiment, the second N$^+$ type buried layer 28 is used as a collector region of the bipolar transistor. Therefore, in the bipolar transistor 37, the N$^+$ lead layer 29 to reach the second N$^+$ type buried layer 28 from the surface of the N-type epitaxial layer 3b is formed. Then, at the portion of the silicon oxide layer 12 aligning with the N$^+$ lead layer 29, a third contact hole 19c is formed. A third aluminum electrode 14c is formed to contact with the lead layer 29 via the third contact hole 19c.

On the other hand, on the surface of the N-type epitaxial layer 3b, a P-type base region 30 is formed. On the surface of the base region 30, an emitter region 31 is selectively formed. In the silicon oxide layer 12, a fourth contact hole 19d and a fifth contact hole 19e are formed at positions respectively aligning with a part of the base region 30 and the emitter region 31. On respective regions 30 and 31, a fourth aluminum electrode 14d and a fifth aluminum electrode 14e are formed, respectively.

On the other hand, in the photodiode 25, the lower N-type epitaxial layer 3a is used as the optical passage 32b. Namely, the first N$^+$ type buried layer 2 and the upper N-type epitaxial layer 3b serve as reflection layers for restricting spreading of the light beam.

In the eighth embodiment constructed as set forth above, the N-type epitaxial layer 3 is separated into the N-type epitaxial layers 3a and 3b by the N$^+$ type buried layer 28 to make the N-type epitaxial layer 3b as active layer of the bipolar transistor 37. Therefore, even when the optical passage in the photodiode 25 is provided relatively large thickness, the depth of the junction can be made shallow for permitting speeding of the high speed bipolar transistor.

On the other hand, as shown in the second embodiment, when the SOI substrate is employed as the substrate of the eighth embodiment, the N$^+$ type buried layer 2 and the lower N-type epitaxial layer 3a which are formed directly on the silicon substrate become unnecessary, and these can be formed with the SOI substrate.

FIGS. 18A to 18G are sections showing the fabrication process of the eighth embodiment of the semiconductor with the photodiode according to the present invention, which are illustrated in order of the process steps.

Figure 18A:
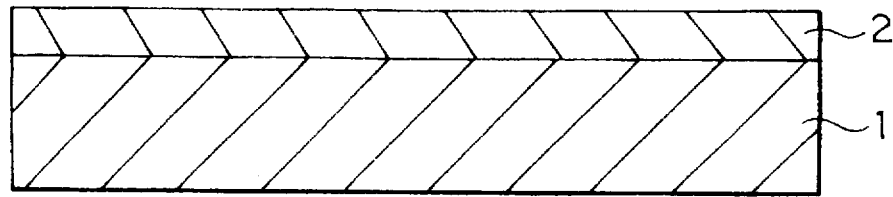
FIGS. 18A to 18G are sections showing a fabrication process of the eighth embodiment of the semiconductor device with the photodiode according to the invention, which are illustrated in order of the process steps.
Figure 18B:
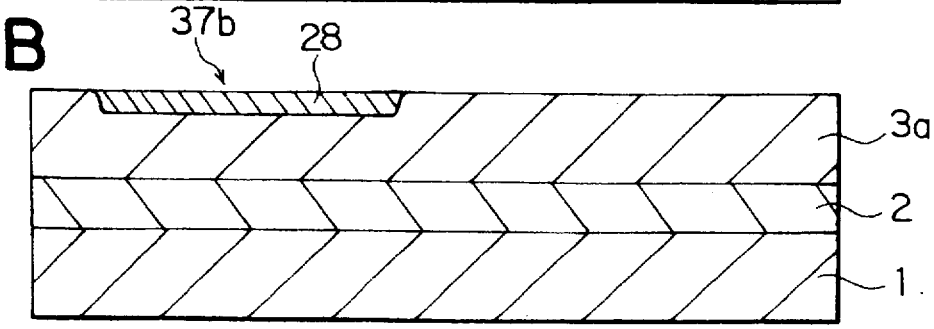

At first, as shown in FIG. 18A, the first N$^+$ type buried layer 2 is formed over the entire surface of the P-type silicon substrate 1. This is similar to the first embodiment. Next, as shown in FIG. 18B, after growing N-type epitaxial layer (first epitaxial layer) 3a on the first N$^+$ type buried layer 2, the second N$^+$ type buried layer 28 is selectively formed in the bipolar transistor formation reserved region 37b.

Figure 18C:
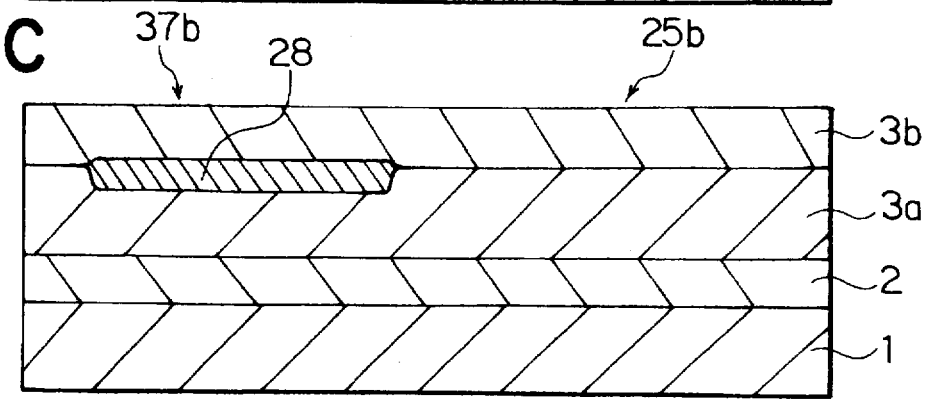
Figure 18D:
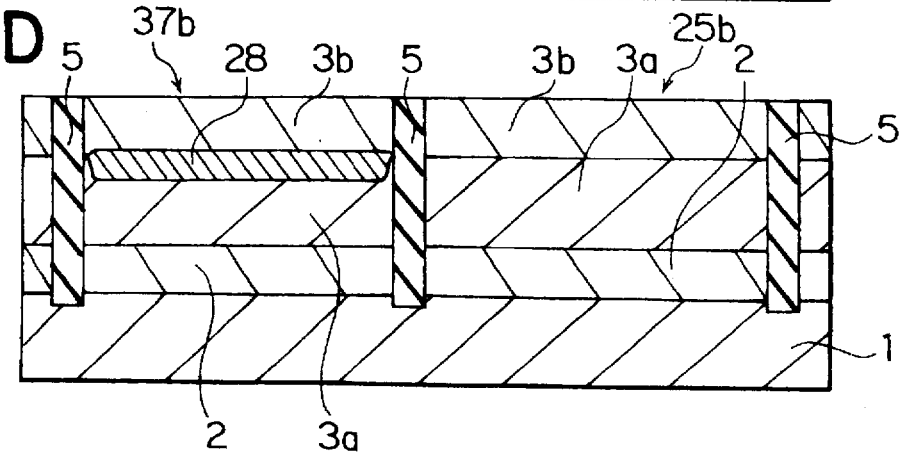

Then, as shown in FIG. 18C, N-type epitaxial layer (second epitaxial layer) 3b is grown over the entire surface. Subsequently, as shown in FIG. 18D, after selectively forming the LOCOS oxide layer (not shown), the isolation region 5 is formed to respectively define the bipolar transistor formation reserved region 37b and the photodiode formation reserved region 25b. As set forth above, the isolation region 5 is formed by filling silicon oxide layer or so forth into the trench after formation of the trench reaching the silicon substrate 1 from the surface of the N-type epitaxial layer 3b.

Figure 18E:
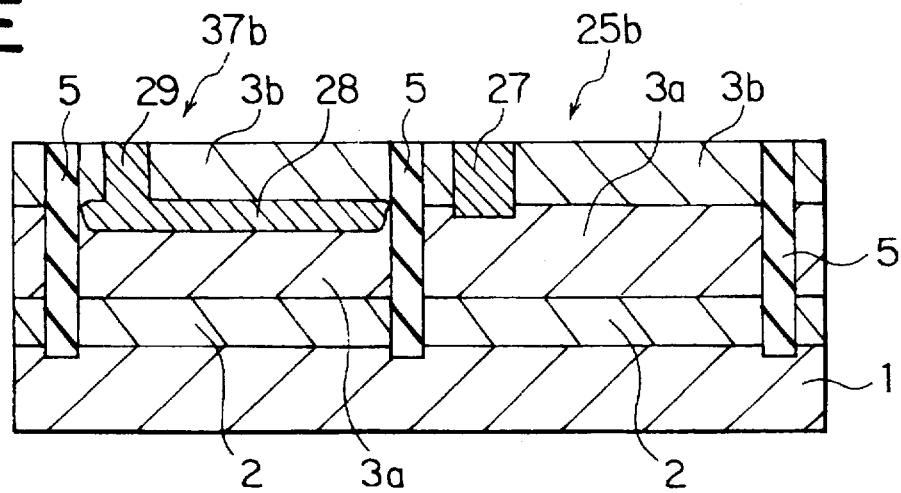

Thereafter, as shown in FIG. 18E, by way of a vapor deposition method or an ion implantation method, the $N^+$ lead layer 29 reaching the second $N^+$ type buried layer 28 from the surface of the N-type epitaxial layer 3b is formed in order to extend the collector (second $N^+$ type buried layer) of the bipolar transistor formation reserved region 37b. At the same time, the $N^+$ lead layer 27 reaching the N-type epitaxial layer 3a from the surface of the N-type epitaxial layer 3b is formed for extending the lower electrode (N-type epitaxial layer 3a) of the photodiode formation reserved region 25b.

Figure 18F:
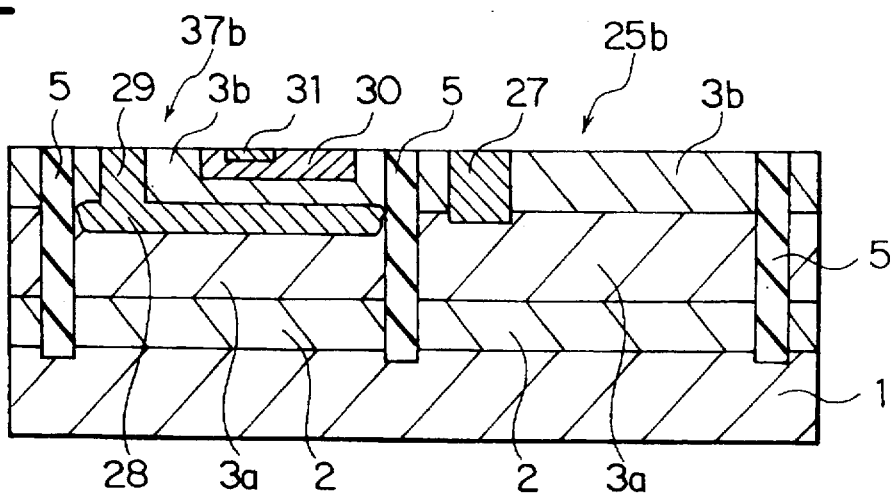

Then, as shown in FIG. 18F, the base region 30 is selectively formed on the surface of the N-type epitaxial layer 3b of the bipolar transistor formation reserved region 37b, and the emitter region 31 is selectively formed on the surface of the base region 30. Thus, the bipolar transistor 37 is formed.

Figure 18G:
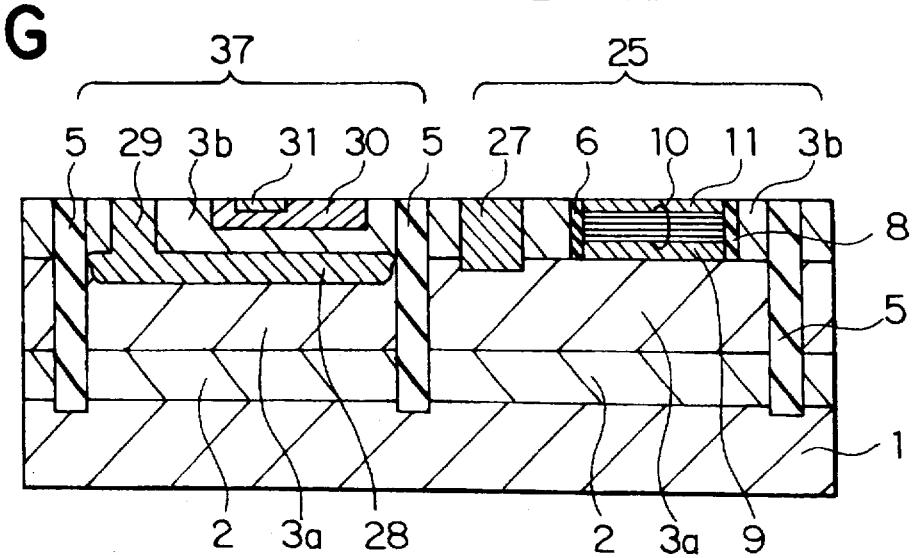

Subsequently, as shown in FIG. 18G, with masking the bipolar transistor 37 with the insulation layer (not shown), the recess 6 is formed in similar manner to the first embodiment, and the silicon oxide layer 8 is formed on the side face thereof. Thereafter, the P-type epitaxial layer (third epitaxial layer) 9, the superlattice layer 10 and the $P^+$ type epitaxial layer 11 are formed in the recess to form the photodiode.

Then, as shown in FIG. 17, after formation of the silicon oxide layer 12 over the entire surface of the N-type epitaxial layer or so forth, the silicon oxide layer 12 is selectively removed by etching. Thereafter, the aluminum electrodes 14a, 14b, 14c, 14d and 14e are formed simultaneously in the bipolar transistor 37 and the photodiode 25.

With the shown embodiment of the fabrication process set forth above, the bipolar transistor 37 and the photodiode 25 are formed on the common substrate. After wiring step, the optical fiber fixing trench (not shown) is formed in the similar manner to the first embodiment. Then, the photodetector and the bipolar integration circuit are packaged on one chip to form the one-chip light receiving circuit can be formed. On the other hand, the shown embodiment can be combined with any of the second to seventh embodiment, and thus can easily fabricate the one-chip light receiving circuit with superior photo absorbing efficiency.

When the shown embodiment is combined with the sixth embodiment, since the $N^+$ lead layer 27 formed in the photodiode 25 is used as the reflection layer (second layer) for the side of the optical passage 32a, it becomes necessary to form the second $N^+$ lead layer 27 reaching the first $N^+$ type buried layer 2 at both sides of the photo absorbing layer. Accordingly, the $N^+$ lead layer 29 for extending the collector, to be formed simultaneously with the $N^+$ type lead layer 27 is formed in greater depth. However, even when the second $N^+$ lead layer 29 or the second $N^+$ type buried layer 28 is formed in the greater depth, no influence will be caused for the bipolar transistor 37.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A semiconductor device having a photodiode comprising:

a silicon substrate;

a photodiode formed on the surface of said silicon substrate, which has a photo absorbing layer formed on the surface of said substrate;

an isolation region for isolation of said photodiode;

an optical waveguide formed on the surface of said substrate adjacent said photodiode across said isolation region, and including a first layer, a second layer formed below said first layer and a third layer formed below said second layer, said first layer and said third layer being formed of materials having a refraction index which is smaller than a refraction index of said second layer, said second layer and said third layer being extended below said photo absorbing layer so that light is introduced below this photo absorbing layer after passing through the second layer and said isolation region, whereby an incident light at said side surface of said second layer is led beneath said photo absorbing layer and along said second layer.

2. A semiconductor device with a photodiode as set forth in claim 1, wherein said photodiode has a planar structure.

3. A semiconductor device with a photodiode as set forth in claim 1, said second layer is formed with an N-type epitaxial layer, and said third layer is an epitaxial layer having a concentration which is higher than a concentration of said N-type epitaxial layer.

4. A semiconductor device with a photodiode as set forth in claim 3, wherein said first layer is formed with a silicon oxide layer.

5. A semiconductor device with a photodiode as set forth in claim 1, wherein said second and third layers are formed with silicon on an insulator layer.

6. A semiconductor device with a photodiode as set forth in claim 1, wherein said photo absorbing layer is formed with Si/SiGe superlattice layers which are arranged in parallel to the surface of said silicon substrate.

7. A semiconductor device with a photodiode as set forth in claim 1, which further comprises an optical fiber fixing trench formed on the surface of said silicon substrate, the end face of said trench forming a side surface of said second layer, whereby the light beam output from the optical fiber fixed to said trench is introduced into said second layer through the end face of said trench.

8. A semiconductor device with a photodiode as set forth in claim 3, wherein said photodiode also has a lower electrode lead layer, and said high concentration epitaxial layer forming at least a part of said lower electrode lead layer.

9. A semiconductor device with a photodiode as set forth in claim 1, wherein said optical waveguide has first regions formed at both sides of said optical waveguide, said light beam passing through said second layer between said first regions, and said first regions are formed of a material having a refraction index which is lower than a refraction index of said second layer.

10. A semiconductor device with a photodiode as set forth in claim 9, wherein said first region is formed with a silicon oxide layer and formed to reach said third layer from the surface of said first layer.

11. A semiconductor device with a photodiode as set forth in claim 9, wherein said first regions are formed such that two first regions define said optical waveguide narrowing toward the traveling direction of the light beam.

12. A semiconductor device with a photodiode as set forth in claim 1, wherein said photo absorbing layer is formed into a configuration which becomes radially wider in the direction in which said light beam propagates from said optical waveguide within a surface parallel to said silicon substrate.

13. A semiconductor device with a photodiode as set forth in claim 7, which further comprises a bond injecting trench formed to be connected to said optical fiber fixing trench.

14. A semiconductor device with a photodiode as set forth in claim 13, which has an end face perpendicular to said optical fiber fixing trench, said bond injecting trench is formed to reach said end face from said optical fiber fixing trench.

15. A semiconductor device with a photodiode as set forth in claim 1, wherein said photodiode has second regions formed at both sides of said photodiode, said light beam inputting into said second layer between said second regions, and said second regions are formed of a material having a refraction index which is lower than a refraction index of said second layer.

16. A semiconductor device with a photodiode as set forth in claim 15, wherein said photodiode has a lower electrode lead layer, and said second regions form at least a part of said lower electrode lead layer.

17. A semiconductor device having a photodiode comprising:

a first conductive type silicon substrate;

a photodiode formed on the surface of said silicon substrate, which has a photo absorbing layer formed on the surface of said silicon substrate;

an isolation region for isolation of said photodiode;

an optical waveguide formed on the surface of said substrate adjacent said photodiode across said isolation region, and including a second conductive type second epitaxial layer, a second conductive type first epitaxial layer formed below said second epitaxial layer and a second conductive type first buried layer formed below said first epitaxial layer, said second epitaxial layer and said first buried layer being formed of materials having a refraction index which is smaller than a refraction index of said first epitaxial layer, said first epitaxial layer and said first buried layer being extended below said photo absorbing layer of said photodiode via said isolation region; and a bipolar transistor formed on said silicon substrate adjacent said photodiode across said isolation region, said second epitaxial layer, the first epitaxial layer and said first buried layer extending toward said bipolar transistor across said isolation region, and said bipolar transistor having a second buried layer formed between said second epitaxial layer and said first epitaxial layer.

18. A semiconductor device with a photodiode as set forth in claim 17, which further comprises a lower electrode lead layer reaching said first epitaxial layer from the surface of said second epitaxial layer, and said photodiode has a third epitaxial layer formed below said photo absorbing layer.

19. A semiconductor device with a photodiode as set forth in claim 18, wherein said third epitaxial layer is formed within said second epitaxial layer.

20. A semiconductor device with a photodiode as set forth in claim 17, wherein said third epitaxial layer is formed in contact with said first epitaxial layer.

* * * * *